US012622296B2

(12) United States Patent
Jeong et al.

(10) Patent No.: US 12,622,296 B2
(45) Date of Patent: May 5, 2026

(54) SEMICONDUCTOR PACKAGE INCLUDING METAL PATTERN LAYER WITH OPEN REGION WHICH OVERLAPS NON-CONTACT PAD

(71) Applicant: SAMSUNG ELECTRONICS CO., LTD., Suwon-si (KR)

(72) Inventors: Sangnam Jeong, Hwaseong-si (KR); Sangsub Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 532 days.

(21) Appl. No.: 18/110,472

(22) Filed: Feb. 16, 2023

(65) Prior Publication Data

US 2023/0260889 A1      Aug. 17, 2023

(30) Foreign Application Priority Data

Feb. 17, 2022      (KR) ........................ 10-2022-0020608

(51) Int. Cl.
*H01L 23/498* (2006.01)
*H05K 1/181* (2026.01)
(Continued)

(52) U.S. Cl.
CPC .. *H01L 23/49838* (2013.01); *H01L 23/49816* (2013.01); *H05K 1/181* (2013.01);
(Continued)

(58) Field of Classification Search
None
See application file for complete search history.

(56) References Cited

U.S. PATENT DOCUMENTS 10,090,263 B2    10/2018  Maruko
10,777,510 B2     9/2020  Lin et al.
(Continued)

FOREIGN PATENT DOCUMENTS

KR       10-0884238       2/2009
KR    10-2019-0082544  A   7/2019
KR    10-2020-0134104  A  12/2020

OTHER PUBLICATIONS

Office Action dated Sep. 5, 2025 issued in corresponding to Korean Patent Application No. 10-2022-0020608.

*Primary Examiner* — Cory W Eskridge
(74) *Attorney, Agent, or Firm* — Morgan, Lewis & Bockius LLP

(57) ABSTRACT

A semiconductor package includes: a package substrate including a plurality of insulating layers and a plurality of metal pattern layers respectively disposed on the plurality of insulating layers, wherein each of the plurality of metal pattern layers has an interconnection layer; at least one semiconductor chip disposed on an upper surface of the package substrate, and connected to the interconnection layer; contact pads disposed on a lower surface of the package substrate, and connected to the interconnection layer; and non-contact pads disposed on the lower surface of the package substrate, and insulated from the interconnection layer, wherein a lowermost metal pattern layer among the plurality of metal pattern layers has a first open region at least partially overlapping at least one non-contact pad among the non-contact pads, in a direction perpendicular to the upper surface of the package substrate.

20 Claims, 10 Drawing Sheets

A1

(51) Int. Cl.
   _H10B 80/00_           (2023.01)
   _H01L 23/00_           (2006.01)
(52) U.S. Cl.
   CPC .............. _H10B 80/00_ (2023.02); _H01L 24/16_
   (2013.01); _H01L 24/32_ (2013.01); _H01L 24/33_
   (2013.01); _H01L 24/48_ (2013.01); _H01L 24/73_
   (2013.01); _H01L 2224/16237_ (2013.01); _H01L_
   _2224/32145_ (2013.01); _H01L 2224/32225_
   (2013.01); _H01L 2224/33181_ (2013.01); _H01L_
   _2224/48091_ (2013.01); _H01L 2224/48105_
   (2013.01); _H01L 2224/48145_ (2013.01); _H01L_
   _2224/48228_ (2013.01); _H01L 2224/73204_
   (2013.01); _H01L 2224/73215_ (2013.01); _H01L_
   _2224/73265_ (2013.01); _H05K 2201/09227_
   (2013.01); _H05K 2201/09236_ (2013.01); _H05K_
   _2201/10159_ (2013.01); _H05K 2201/10734_
   (2013.01)

(56)                References Cited

U.S. PATENT DOCUMENTS

| | | | |
|---|---|---|---|
| 11,063,008 | B2 | 7/2021 | Lin et al. |
| 2007/0284729 | A1 | 12/2007 | Kwon et al. |
| 2013/0221519 | A1 | 8/2013 | Hwang et al. |
| 2016/0358866 | A1 | 12/2016 | Zu et al. |
| 2018/0331035 | A1* | 11/2018 | Zhang ..................... H01L 23/48 |
| 2019/0206797 | A1 | 7/2019 | Lee et al. |
| 2020/0373243 | A1 | 11/2020 | Jang et al. |
| 2021/0183816 | A1 | 6/2021 | Jun et al. |
| 2021/0184326 | A1* | 6/2021 | Ong ........................ H01L 25/18 |
| 2021/0335736 | A1 | 10/2021 | Kang |
| 2023/0068485 | A1* | 3/2023 | Hsueh ................ H01L 23/5226 |
| 2023/0127676 | A1* | 4/2023 | Park ........................ H01L 24/13 |
| | | | 257/245 |

* cited by examiner

A2

A3
(LV1)

A3
(LV2)

A3

SEMICONDUCTOR PACKAGE INCLUDING METAL PATTERN LAYER WITH OPEN REGION WHICH OVERLAPS NON-CONTACT PAD

CROSS-REFERENCE TO RELATED APPLICATION

This application claims benefit of priority under 35 U.S.C. 119(a) to Korean Patent Application No. 10-2022-0020608 filed on Feb. 17, 2022, in the Korean Intellectual Property Office, the disclosure of which is incorporated by reference herein in its entirety.

TECHNICAL FIELD

The present inventive concept relates to a semiconductor package. More particularly, the present inventive concept relates to a semiconductor package including a metal pattern layer having an open region.

DISCUSSION OF THE RELATED ART

According to the development of the electronics industry and the desires of users, electronic devices are becoming lighter, thinner, and smaller. According to this trend, it is increasing desirable for semiconductor packages used in electronic devices to have high performance (e.g., high speed) and high capacitance. In addition, as an example, the semiconductor package may be provided as a Ball Grid Array (BGA) package to be mounted on an electronic device.

When a semiconductor package is mounted on a main board of an electronic device, characteristic degradation may occur due to conductive bumps (e.g., balls) connected to a signal line of the main board.

SUMMARY

According to an example embodiment of the present inventive concept, a semiconductor package includes: a package substrate including a plurality of insulating layers and a plurality of metal pattern layers respectively disposed on the plurality of insulating layers, wherein each of the plurality of metal pattern layers has an interconnection layer; at least one semiconductor chip disposed on an upper surface of the package substrate, and connected to the interconnection layer; contact pads disposed on a lower surface of the package substrate, and connected to the interconnection layer; and non-contact pads disposed on the lower surface of the package substrate, and insulated from the interconnection layer, wherein a lowermost metal pattern layer among the plurality of metal pattern layers has a first open region at least partially overlapping at least one non-contact pad among the non-contact pads, in a direction perpendicular to the upper surface of the package substrate.

According to an example embodiment of the present inventive concept, a semiconductor package includes: a package substrate including a plurality of insulating layers and a plurality of metal pattern layers respectively disposed on the plurality of insulating layers, wherein each of the plurality of metal pattern layers has an interconnection layer; a first semiconductor chip disposed on first surface of the package substrate, and connected to the interconnection layer; a second semiconductor chip disposed on the first surface of the package substrate, and connected to the interconnection layer; contact pads disposed on a second surface of the package substrate, and connected to the interconnection layer, wherein the contact pads include first and second signal pads for transmitting a differential signal; and non-contact pads disposed on the second surface of the package substrate, and insulated from the interconnection layer, wherein the non-contact pads include at least one non-contact pad disposed adjacent to the second signal pad and positioned closer to an edge of the package substrate than the second signal pad, wherein a first metal pattern layer among the plurality of interconnection layers has an open region overlapping the at least one non-contact pad among the non-contact pads in a direction perpendicular to the first surface of the package substrate.

According to an example embodiment of the present inventive concept, a semiconductor package includes: a package substrate having a plurality of insulating layers and a plurality of metal pattern layers respectively disposed on the plurality of insulating layers, wherein each of the plurality of metal pattern layers has an interconnection layer; at least one semiconductor chip disposed on an upper surface of the package substrate, and connected to the interconnection layer; contact pads disposed on a lower surface of the package substrate, and connected to the interconnection layer, wherein the contact pads include a first signal pad and a second signal pad for transmitting a differential signal; non-contact pads disposed on the lower surface of the package substrate, and insulated from the interconnection layer; contact bumps respectively disposed on the contact pads; and non-contact bumps respectively disposed on the non-contact pads, wherein a lowermost metal pattern layer among the plurality of interconnection layers has an open region at least partially overlapping at least one non-contact pad among the non-contact pads.

BRIEF DESCRIPTION OF DRAWINGS

The above and other aspects of the present inventive concept will become more apparent by describing in detail embodiments thereof, with reference to the accompanying drawings, in which.

DETAILED DESCRIPTION OF THE EMBODIMENTS

Hereinafter, example embodiments of the present inventive concept will be described in detail with reference to the accompanying drawings.

Figure 1:
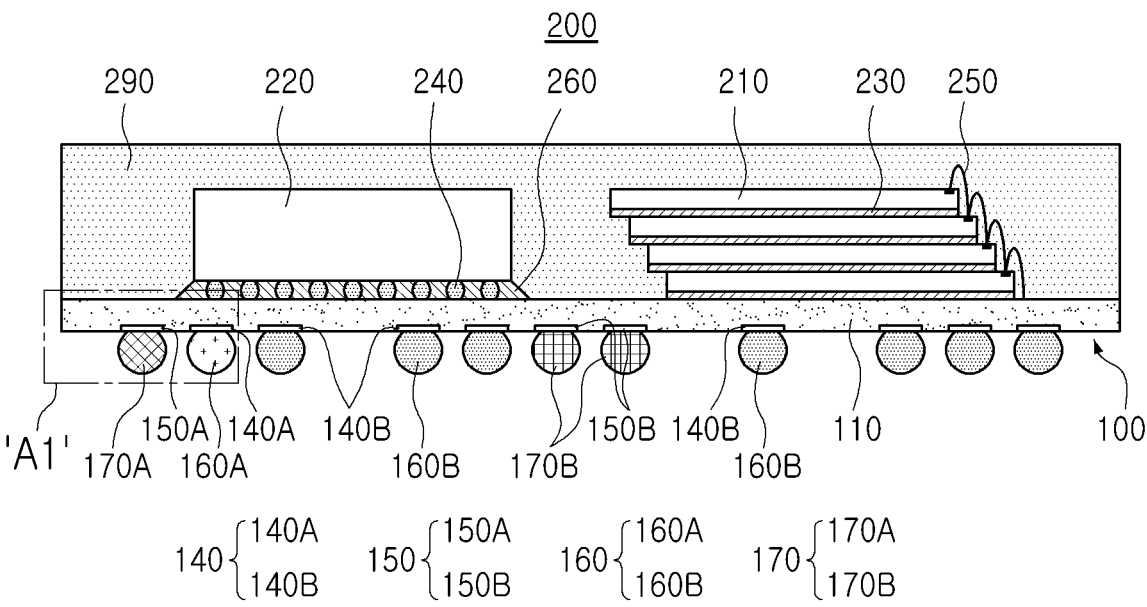
FIG. 1 is a cross-sectional view illustrating a semiconductor package according to an example embodiment of the present inventive concept.
Figure 2:
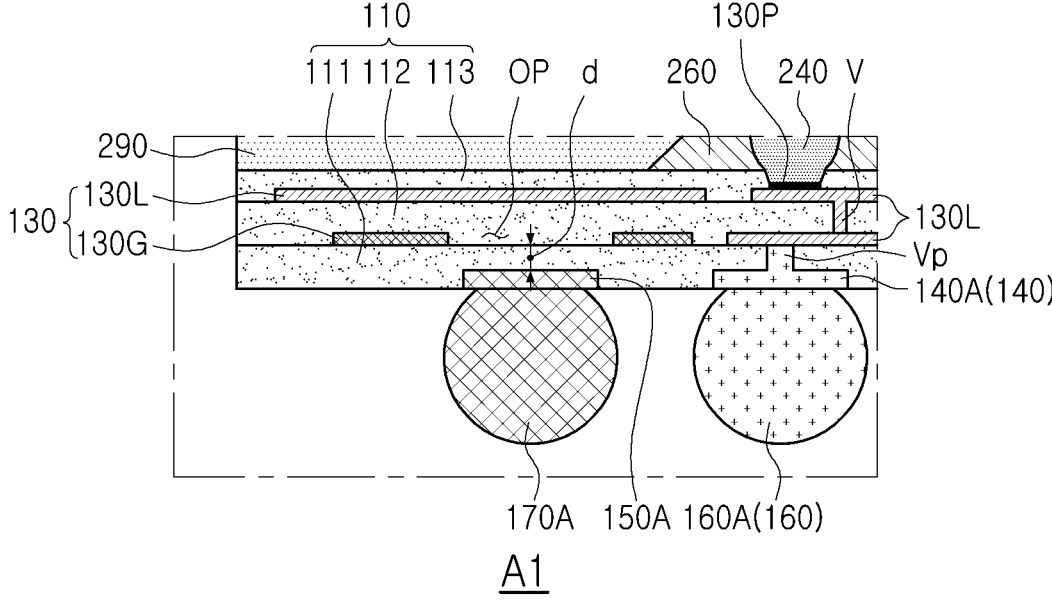
FIG. 2 is a partially enlarged view of portion ("A1") of the semiconductor package of FIG. 1.

FIG. 1 is a cross-sectional view illustrating a semiconductor package according to an example embodiment of the present inventive concept, and FIG. 2 is an enlarged partial view of portion ("A1") of the semiconductor package of FIG. 1.

Referring to FIGS. 1 and 2, a semiconductor package 200 includes a package substrate, and a first semiconductor chip and a second semiconductor chip disposed on the package substrate.

The package substrate 100 may include a body portion 110, a plurality of metal pattern layers 130, contact pads 140, and non-contact pads 150. The body portion 110 may have a plurality of insulating layers 111, 112, and 113, and a plurality of metal pattern layers 130 may be respectively disposed on the plurality of insulating layers 111, 112, and 113. The contact pads 140 and non-contact pads 150 may be disposed on a lower surface of the body portion 101. Here, the plurality of metal pattern layers 130 may include interconnection layers 130L and ground pattern layers 130G. The interconnection layers 130L may be interconnected to each other by a via V, and may constitute a redistribution circuit. The contact pads 140 may be connected to the interconnection layers 130L by a pad via Vp, and the non-contact pads 150 might not be connected to the interconnection layer 130L and may be separated from the redistribution circuit.

For example, the package substrate 100 may be a printed circuit board. The package substrate 100 is not limited to a printed circuit board, and may be interconnection substrate of various types.

The package substrate 100 may be made of at least one of a phenol resin, an epoxy resin, and a polyimide. For example, the package substrate 100 may include FR4, tetrafunctional epoxy, polyphenylene ether, epoxy/polyphenylene oxide, bismaleimidetriazine (BT), Thermount, cyanate ester, polyimide, and/or liquid crystal polymer. In addition, the metal pattern layer 130, the contact pads 140, and the non-contact pads 150 may include, for example, copper (Cu), nickel (Ni), aluminum (Al), and/or beryllium copper.

Conductive bumps 160 and 170 may be formed on the contact pads 140 and the non-contact pads 150 of the package substrate 100, respectively. The conductive bumps 160 and 170 may include, for example, a solder ball, and the semiconductor package 200 may be a ball grid array (BGA) package.

The contact pads 140, which are connected to the interconnection layer 130L, may include a first contact pad 140A and a second contact pad 140B. The first contact pad 140A transmits a signal that is relatively sensitive to impedance, and the second contact pad 140B transmits a power signal or a ground signal. First and second contact bumps 160A and 160B may be disposed on the first and second contact pads 140A and 140B, respectively.

Figure 3:
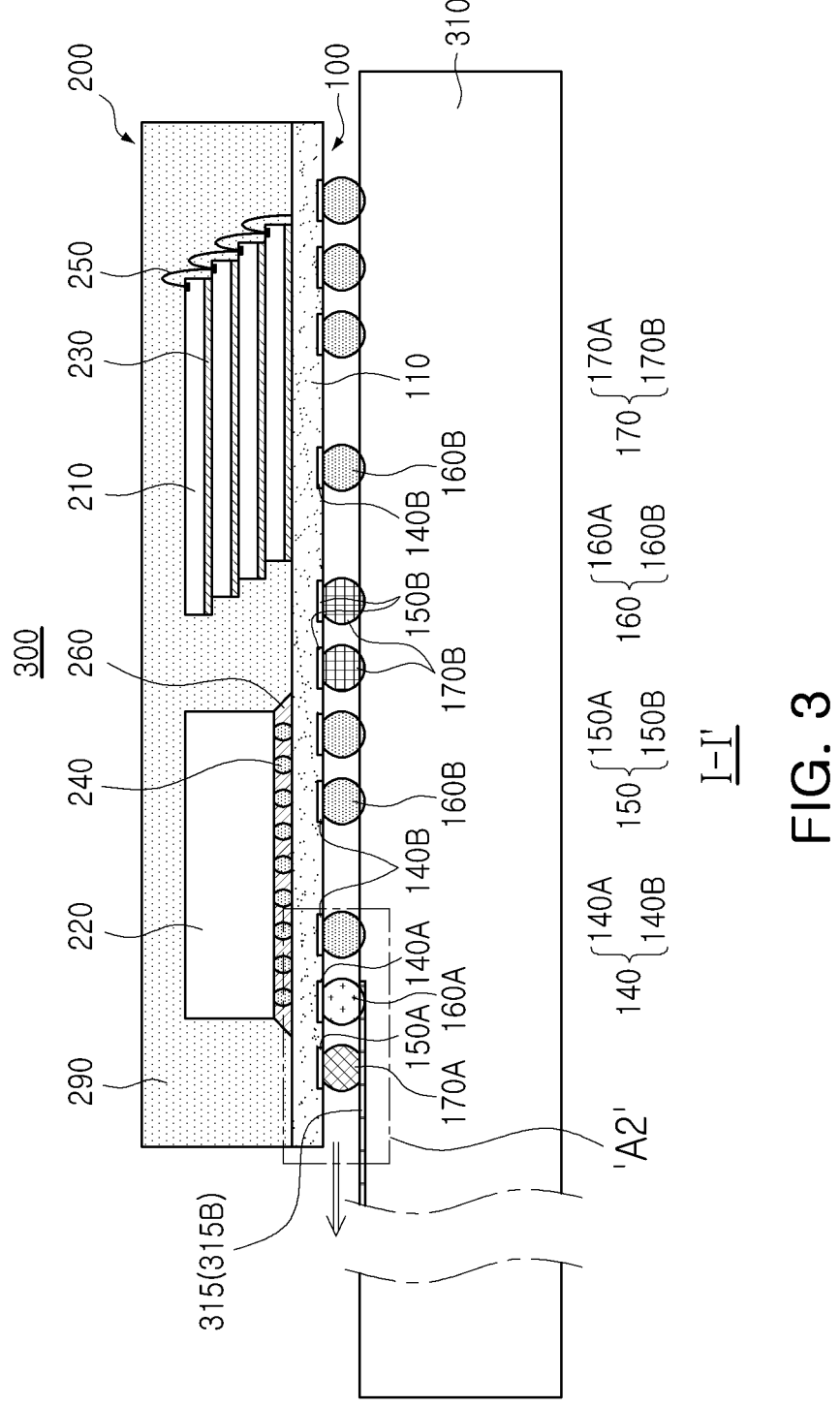
FIG. 3 is a cross-sectional view illustrating a circuit board on which the semiconductor package of FIG. 1 is mounted.

As described above, in the non-contact pad 150 connected to the wiring layer 130L, similar to the contact bump 160, a non-contact bump 170 may be disposed on the non-contact pad 150, and as illustrated in FIG. 3, stable support of the semiconductor package 200 on a main board (see FIG. 3) may be achieved.

In the present example embodiment, the non-contact pad 150 may be divided into a first non-contact pad 150A and a second non-contact pad 150B depending on whether it is connected to a signal line of the main board. Similarly thereto, the non-contact bump 170 may be divided into first and second non-contact bumps 170A and 170B, which are respectively disposed on the first and second non-contact pads 150A and 150B.

Figure 4:
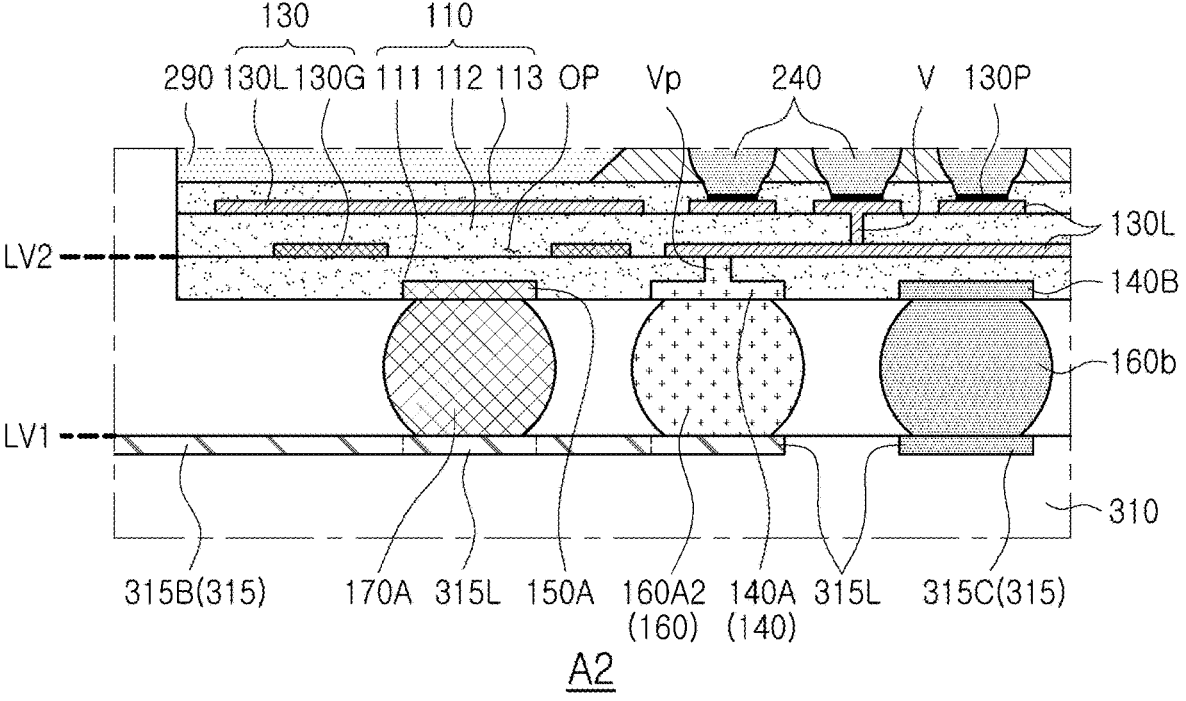
FIG. 4 is a partial enlarged view illustrating an enlarged portion "A2" of FIG. 3.

FIG. 3 is a cross-sectional view illustrating a circuit board 310 on which the semiconductor package 200 of FIG. 1 is mounted, and FIG. 4 is a partially enlarged view illustrating portion "A2" of FIG. 3. The electronic device 300 illustrated in FIG. 3 may be, for example, an electronic device having a memory device such as a universal flash storage (UFS) card.

Referring to FIG. 3, the first non-contact pad 150A may be electrically connected to the same signal line 315B as the first contact pad 140A through the first non-contact bump 170A. Here, the first non-contact pad 150A and the first non-contact bump 170A may serve as stubs of the signal line 315B.

In the present embodiment, to reduce the stub influence due to the first non-contact bump 170A, an open region OP may be included in a metal pattern layer 130 (e.g., a lowermost metal pattern) that is disposed on a lowermost insulating layer 111. For example, the lowermost metal pattern layer 130 may be disposed on the lowermost insulating layer 111 in a direction substantially perpendicular to an upper surface of the package substrate 100.

By reducing capacitance generated in the first non-contact bump 170A by the open region OP, an influence of the stub on the first non-contact bump 170A can be reduced. As a thickness d of the lowermost insulating layer 111 decreases, capacitance due to the adjacent metal pattern layer may increase, so that the influence of the impedance caused by the formation of the open region OP can be effectively reduced. For example, when the thickness d of the lowermost insulating layer 111 is about 20 μm or less, for example, about 15 μm or less, an effect of the formation of the open region OP may be expected.

The open region OP may have a larger than a planar area of the first non-contact pad 150A. In an example embodiment of the present inventive concept, the metal pattern layer on which the open region OP is formed may be a ground pattern 130G.

The first non-contact pad 150A may be located in a region adjacent to an edge of the package substrate 100 around a first contact pad 140A that is connected to the same signal line (refer to 315B of FIG. 3) as that of the first non-contact pad 150A. In this arrangement, since a signal line 315B connected by the first contact bump 160A extends externally (in a direction of an arrow) toward the first non-contact pad 150A, the signal line 315B must also be connected to a first non-contact bump 150A located in an extension path thereof, and as a result thereof, the first non-contact bump 150A may act as a stub of the signal line 315B. As in the present embodiment, the first non-contact pad 150A and the first non-contact bump 170A may be disposed on an outermost side of the package substrate 100 to be adjacent to an edge of the package substrate 100. For example, the first non-contact pad 150A may be most adjacent to the edge (e.g., a first edge) of the package substrate 100 of the contact pads 140 and 150.

In addition, the non-contact pad 150 employed in this embodiment may include a second non-contact pad 150B that is not electrically connected to the same signal line 315B as that of the first contact pad 140A. Since the second non-contact pad 150B does not act as a stub for a specific signal line, an additional open region might not be required in the adjacent metal pattern layer.

Although the first and second contact pads 140A and 140B and the first and second non-contact pads 150A and 150B are illustrated differently in this embodiment, they may be formed of the same material and in the same process as each other. Similarly thereto, although the first and second contact bumps 160A and 160B and the first and second non-contact bumps 170A and 170B are illustrated differently, in reality, they may be formed of the same material in the same process as each other.

In the present embodiment, the first semiconductor chip 210 may include a plurality of semiconductor chips provided as a chip stack structure. In the chip stack structure, a plurality of semiconductor chips 210 may be stacked in a stepwise manner or such that they are misaligned with one another. The first semiconductor chips 210 may be memory chips. For example, the memory chips may include a non-volatile memory semiconductor chip. The non-volatile memory semiconductor chip may be, for example, a NAND flash memory, a resistive random access memory (RRAM), a magnetoresistive RAM (MRAM), a phase-change RAM (PRAM), or a ferroelectric RAM (FRAM).

An adhesive layer 230 may be interposed between the first semiconductor chips 210. For example, the adhesive layer 230 may be a material such as direct adhesive film (DAF) or film over wire (FOW). Each of the first semiconductor chips 210 may include chip pads disposed on one side of an upper surface thereof. Each of the first semiconductor chips 210 may be stacked so that chip pads on one side are exposed, and wires 250 may be connected to each other between the chip pads between the adjacent semiconductor chips 210 and connected to the upper pad 130P of the package substrate 100.

The second semiconductor chip 220 may be disposed on the body portion 110 and may be connected to the interconnection layer 130L through conductive bumps 240. A filler 260 may be disposed between the second semiconductor chip 220 and the body portion 110 and may surround the conductive bumps 240. The second semiconductor chip 220 may be, for example, a processor chip controlling the first semiconductor chip 210, a non-volatile memory semiconductor. The processor chip may be configured to transmit/receive data to and from an external device using a serial interface. For example, the processor chip may be configured to support a universal flash storage (UFS) interface protocol, a peripheral component interconnect express (PCIe) interface protocol, or a USB 3.0 interface protocol.

In an example embodiment of the present inventive concept, the first and second lower semiconductor chips 210 and 220 may be different memory chips or processor chips. In an example embodiment of the present inventive concept, the first semiconductor chip 210 might not be limited to a non-volatile memory chip, but may be a volatile memory chip or a combination thereof. For example, the volatile memory chip may include a dynamic random access memory (DRAM), a static RAM (SRAM), a thyristor RAM (TRAM), a zero capacitor RAM (ZRAM), or a twin transistor RAM (TTRAM). In an example embodiment of the present inventive concept, the second semiconductor chip 220 may include a central processor (CPU), a graphics processor (GPU), a field programmable gate array (FPGA), a digital signal processor (DSP), a cryptographic processor, a microprocessor, a microcontroller, an analog-to-digital converter, and an application-specific IC (ASIC). Depending on the type of the first and second semiconductor chips 220 and 230, the semiconductor package 1000 may be a server-oriented semiconductor package, a mobile-oriented semiconductor package, or an automotive-oriented semiconductor package.

The semiconductor package 200 employed in this example embodiment may further include a molded portion 290 surrounding the first semiconductor chip 210 and the second semiconductor chip 220.

The molded portion 290 may serve to protect the first semiconductor chip 210 and the second semiconductor chip 220 from the outside. For example, the molded portion 290 may be formed by injecting an appropriate uncured resin onto the package substrate 100 and then curing the resin. In a process of forming the molded portion 290 (e.g., transfer molding), pressure may be applied to a molding resin by a pressing means such as a press. Here, process conditions such as a delay time between injection and pressing of a molding resin, an amount of the injected molding resin, and a pressing temperature/pressure may be set in consideration of physical properties such as viscosity of the molding resin. For example, the molded portion 290 may include an epoxy-group molding resin or a polyimide-group molding resin. For example, the molded portion 290 may include an epoxy molding compound (EMC) or a high-k epoxy molding compound.

The present inventive concept can be used in a contact pad for transmitting a differential signal. For example, when the first contact pad includes first and second signal pads for transmitting a differential signal, and a non-contact bump (or a pad) is connected to a signal line connected to any one of the first or second signal lines, the present inventive concept may be applied.

Figure 5:
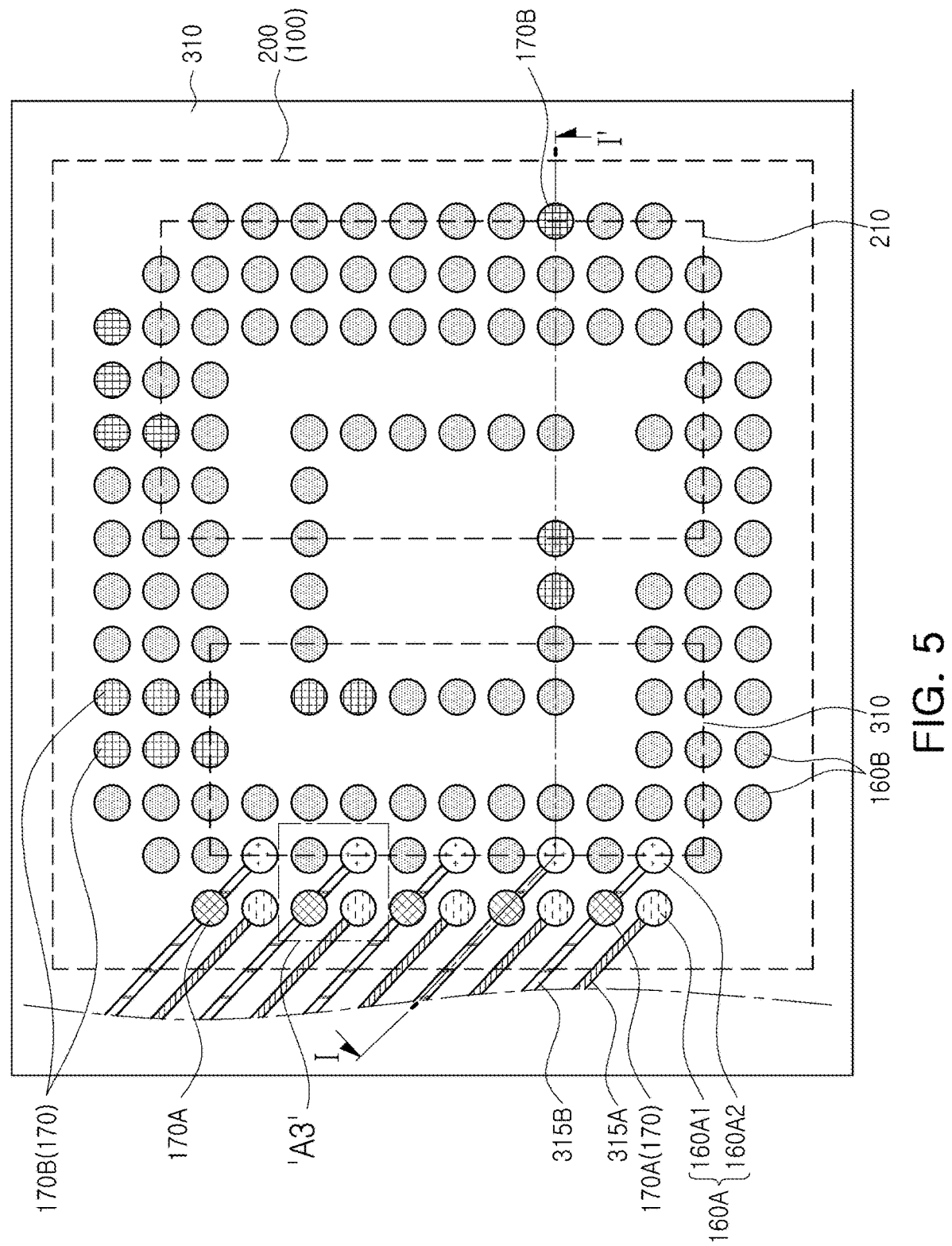
FIG. 5 is a plan view illustrating signal routing of a circuit board on which a semiconductor package is mounted and an arrangement of conductive bumps in the semiconductor package according to an embodiment of the present inventive concept.

FIG. 5 is a plan view illustrating signal routing of a circuit board on which a semiconductor package is mounted and an arrangement of conductive bumps of the semiconductor package according to the present example embodiment.

Referring to FIG. 5, a plan view of a circuit board 310, on which the semiconductor package 200 according to the present example embodiment is mounted, is illustrated. The cross-section of FIG. 3 above may be understood as a cross-section viewed along line I-I' of the electronic device 300 of FIG. 5.

A semiconductor package 200 indicated by a dotted line may be the semiconductor package 200 described with reference to FIGS. 1 and 2. The semiconductor package 200 is configured to transmit/receive data to and from an external device using a serial interface, and FIG. 5 illustrates signal routing of the circuit board 310 according to the serial interface.

In FIG. 4, although a portion of circuit lines of the circuit board are illustrated together with an arrangement of conductive bumps 160 and 170 of the semiconductor package 200, for convenience of explanation, only first and second signal lines for transmitting a differential signal among the circuit lines are illustrated. First and second signal lines 315A and 315B are arranged in a diagonal direction on one side of the semiconductor package 200 with respect to a side of the semiconductor package 200.

Figure 6:
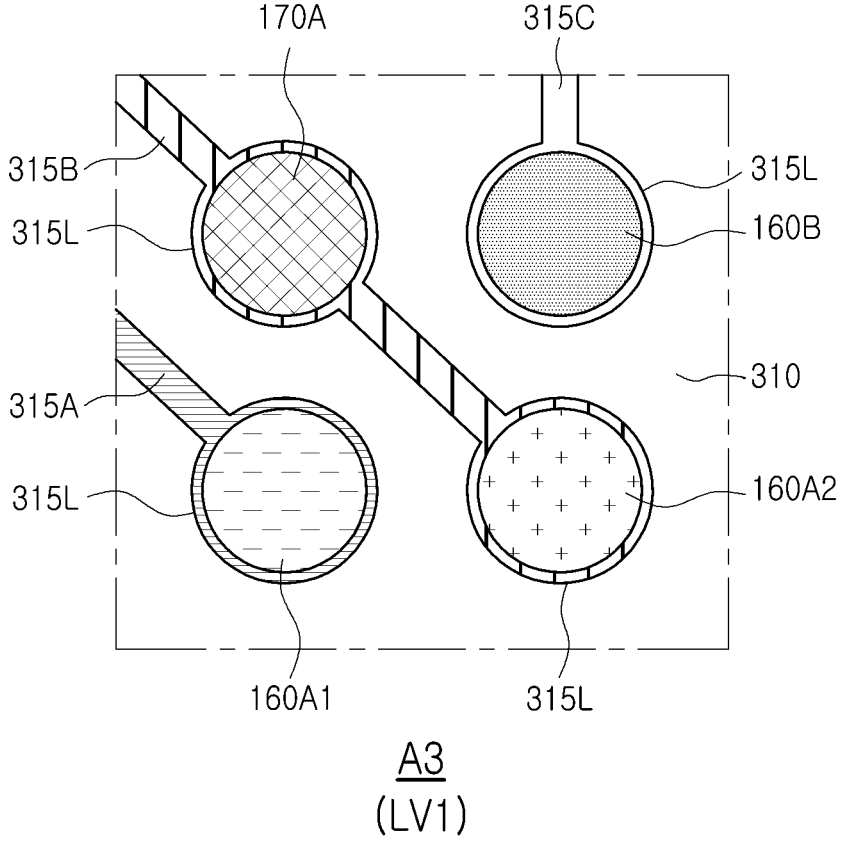
FIGS. 6 and 7 are partial plan views illustrating portion "A3" of FIG. 5 at a first level LV1 and a second level LV2, respectively.

FIG. 6 is a partially enlarged plan view illustrating portion "A3" of FIG. 5 at a first level (LV1 in FIG. 4), illustrating routing of a circuit board and arrangement of conductive bumps. Referring to FIG. 6 together with FIG. 5, a first contact bump 160A employed in the present example embodiment includes first and second signal bumps 160A1 and 160A2 for transmitting a differential signal, respectively. The first and second signal bumps 160A1 and 160A2 may be respectively connected to one end of the first and second signal lines 315A and 315B. The first signal bump 160A1 may be disposed adjacent to the related second signal bumps 160A2, but may be disposed closer to one edge of the semiconductor package 200 than the adjacent second signal bump 160A2. In the present example embodiment, the first signal bump 160A1 may be disposed more adjacent to an outermost side of the semiconductor package 200 when compared to the second signal bump 160A2, and the second signal bump 160A2 may be disposed further inward on the surface of the semiconductor package 200 when compared to the first signal bump 160A1. For example, the first signal bump 160A1 may be disposed between the one edge of the semiconductor package 200 and the second signal bump 160A2.

The first and second signal lines 315A and 315B may include one or more lands 315L having a relatively large area, and the conductive bumps including the first and second signal bumps 160A1 and 160A2 may be disposed on the lands 315L, respectively.

As illustrated in FIG. 6, a first signal line 315A connected to the first signal bump 160A1 may extend externally without passing through other bumps, while a second signal line 315B connected to the second signal bump 160A2 may extend through the first non-contact bump 170A disposed closer to the edge of the semiconductor package 200 when compared to the second signal bump 160A2. In addition, the first non-contact bump 170A may be disposed side by side at the edge of the package substrate 100 together with the first signal pad 160A1. For example, the first non-contact bump 170A and the first signal pad 160A1 may be arranged in a direction parallel to the direction in which the edge of the package substrate 100 extends.

Another contact bump transmitting a power signal and/or a ground signal, e.g., the second contact bump 160B may be connected to another signal line. Another non-contact bump, for example, the second non-contact bump 170B, may be connected to a land of a signal line other than the first and second signal lines 315A and 315B or a dummy land.

In this arrangement, in a signal transmitted from the first signal bump 160A1 through the first signal line 351A may be unaffected by the other conductive bumps, while, in a signal transmitted from the second signal bump 160A2 from the second signal bump 160A2 to the second signal line 351A, the first non-contact bump 170A acts as a stub to affect impedance. As a result, impedance discontinuity of signals transmitted from the first and second signal lines may be generated.

Figure 7:
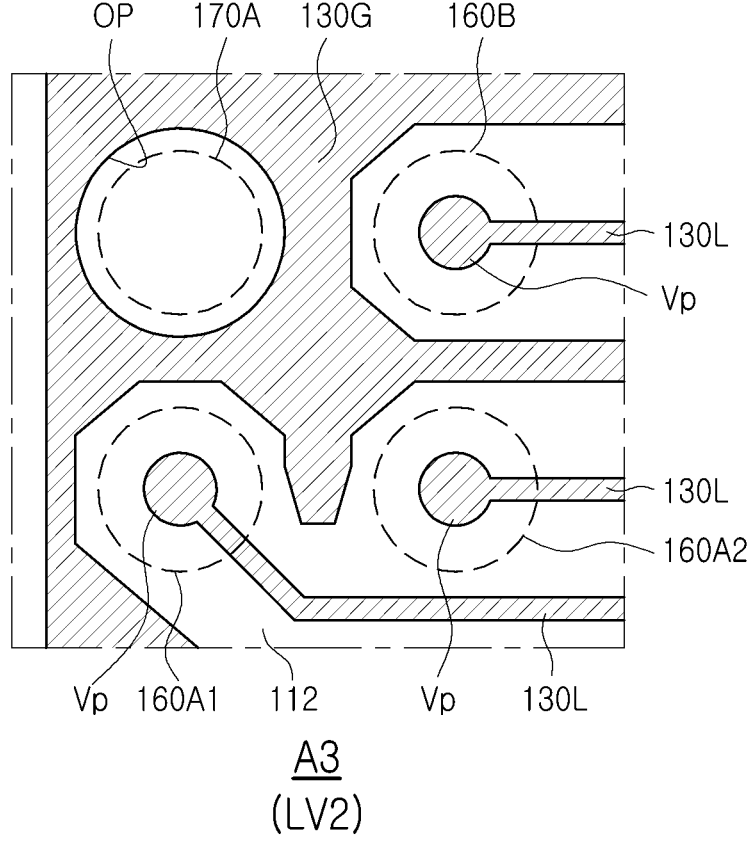

To minimize the influence of this impedance, as illustrated in FIG. 7, by forming an open region OP in a region of the metal pattern layer 130G that is vertically overlapped with the first non-contact bump 170A (or the first non-contact pad 150A), capacitance due to the first non-contact bump 170 (or the first non-contact pad 150A) and the metal pattern layer adjacent thereto may be reduced.

Figure 9:
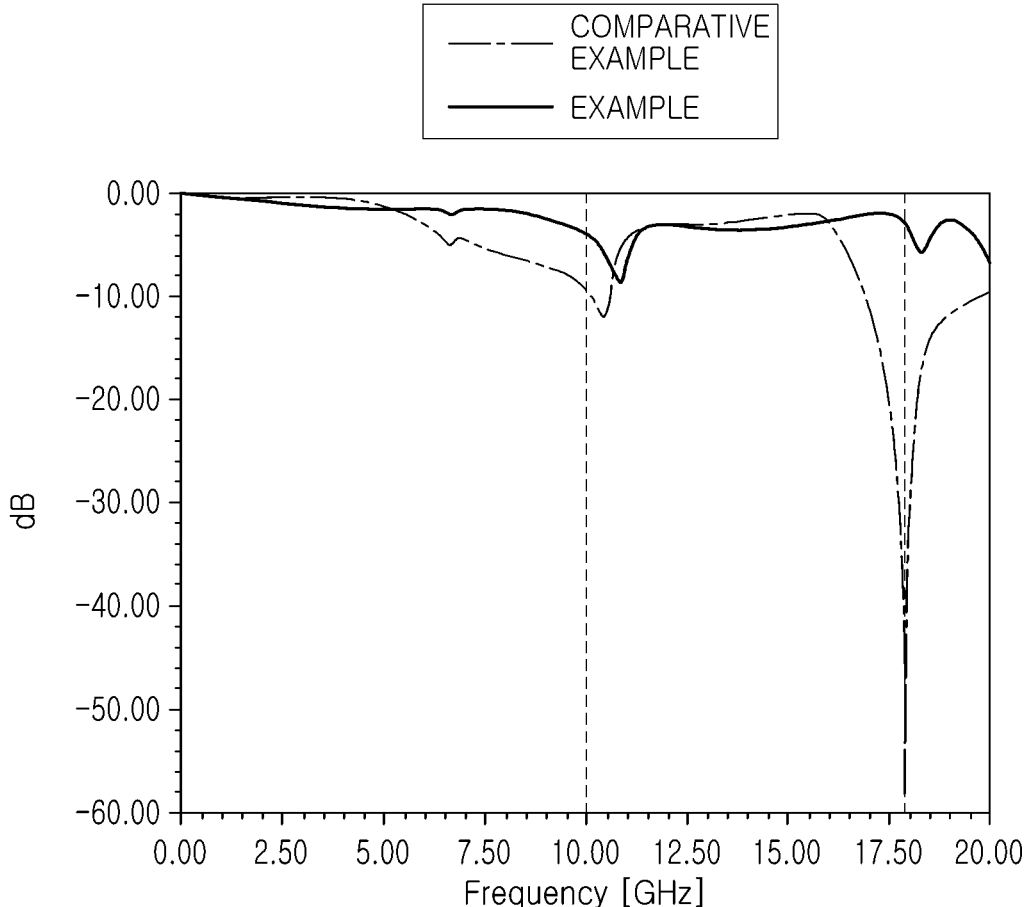
FIG. 9 is a graph illustrating delivery characteristics according to the introduction of an example embodiment of the present inventive concept.

FIG. 9 is a graph illustrating delivery characteristics according to the introduction of an example embodiment of the present inventive concept.

Referring to FIG. 9, as illustrated in FIG. 7, impedance attenuation characteristics in a form in which an open region OP is introduced (Example) and a form in which an open region OP is not introduced (Comparative Example) are compared with each other and illustrated. It can be seen that a difference in characteristics therebetween is large in a high-frequency band of about 10 GHz or more. For example, in the band of about 10 GHz or more, the characteristic in Example (S-parameter transmission characteristic) was about −4.06 dB, whereas the characteristic in Comparative example was a relatively large, about −9.47 dB, and in a band of about 18 GHz or more, a difference therebetween becomes larger, and the characteristic in Example was about −3.08 dB, whereas the characteristic in Comparative example was about −50.63 dB, which is relatively large. As described above, it could be confirmed that the higher a signal transmission speed, the greater a stub influence due to the non-contact bump, and the greater an improvement effect due to the introduction of the open region.

In the present example embodiment, as illustrated in FIG. 7, the open region OP, located in the ground pattern 130G, may have a hole shape. The open region OP may have a larger area than that of the first non-contact pad 150A. A plan view of the level LV2 illustrated in FIG. 7 illustrates a lowermost metal pattern layer between the first and second insulating layers 111 and 112 in the cross-section illustrated in FIG. 4.

By forming an open region OP in a metal pattern layer located above a first non-contact pad (or a pad) connected to a second signal line 351B connected to one pad (or a bump 160A2) of the first and second signal pads for transmitting a differential signal, capacitance generated by the first non-contact bump 170A may be reduced. As a result, it is possible to reduce discontinuity of differential impedance and improve the SI characteristic.

Figure 8:
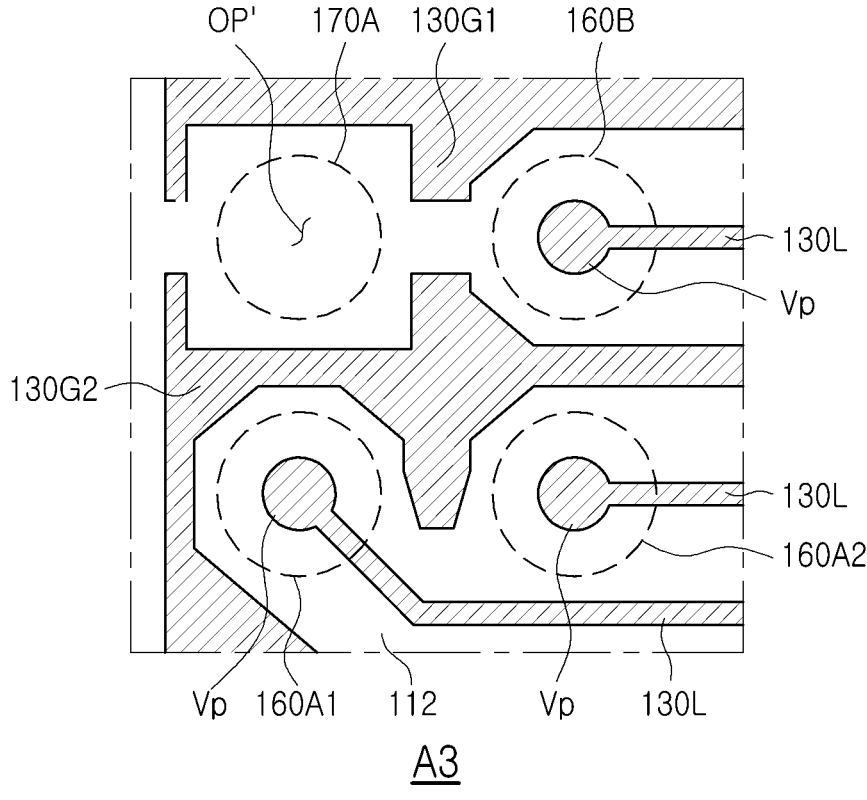
FIG. 8 is a plan view illustrating a portion of a package substrate of a semiconductor package according to an example embodiment of the present inventive concept.

FIG. 8 is a plan view illustrating a portion of a package substrate of a semiconductor package according to an example embodiment of the present inventive concept.

Referring to FIG. 8, an open region OP' introduced in the present example embodiment might not have a closed hole structure surrounded by a ground pattern, but may have a partially opened shape. For example, the open region OP' may be provided as a spaced apart space between first and second ground patterns 130G1 and 130G2. In addition, the open region OP' introduced in the present example embodiment may have various polygonal shapes such as a quadrangular shape. In an example embodiment of the present inventive concept, the open region introduced in the present example embodiment might not be formed by further processing a ground pattern, but may be provided as an open region in which a metal pattern does not exist in a region overlapping the first non-contact bump in a vertical direction by changing a path of the interconnection layer.

Figure 10:
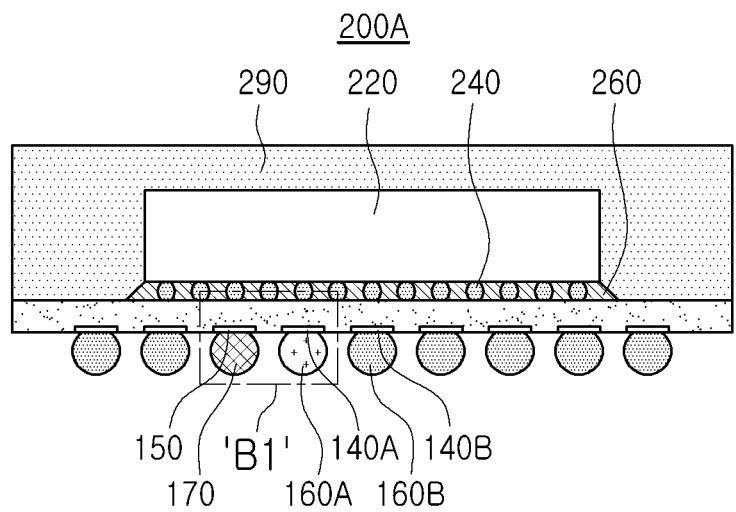
FIG. 10 is a cross-sectional view illustrating a semiconductor package according to an example embodiment of the present inventive concept.
Figure 11:
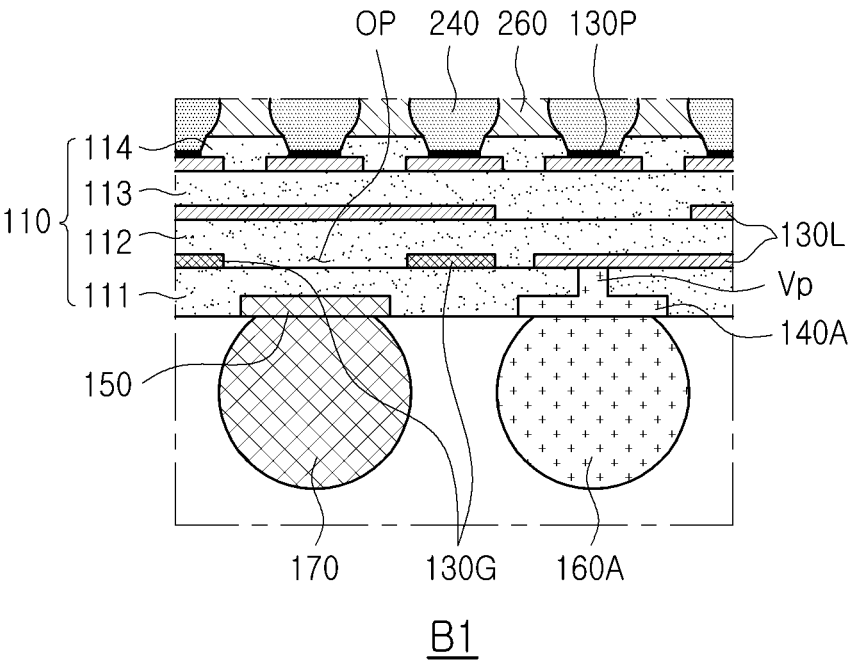
FIG. 11 is an enlarged partial view of portion ("B1") of the semiconductor package of FIG. 10.

FIG. 10 is a cross-sectional view illustrating a semiconductor package 200A according to an example embodiment of the present inventive concept, and FIG. 11 is an enlarged partial view of a portion ("B1") of the semiconductor package 200A of FIG. 10.

Referring to FIGS. 10 and 11, it the structure is similar to that in the example embodiment illustrated in FIGS. 1 to 7, except that the semiconductor package 200A according to the present example embodiment includes one semiconductor chip 220 and an open region OP located on a non-contact pad 150 that is located in an inner region of a lower surface of the package substrate 100. Accordingly, the description of the example embodiment illustrated in FIGS. 1 to 7 may be combined with the description of the present example embodiment unless otherwise specifically stated.

The semiconductor package 200A according to the present example embodiment may include one semiconductor chip 220. In addition, a first contact pad 140A, which is for transmitting a signal, and a first non-contact pad 150A adjacent thereto may be located in an inner region of a lower surface of the package substrate 100. The first contact bump 160A of the first contact pad 140A and the first non-contact bump 170A of the first non-contact pad 150A may be connected to each other on the same line. In this case, as illustrated in FIG. 11, an open region OP may be positioned in a region of the metal pattern layer 130 that is vertically overlapped with the first non-contact pad 150.

Figure 12:
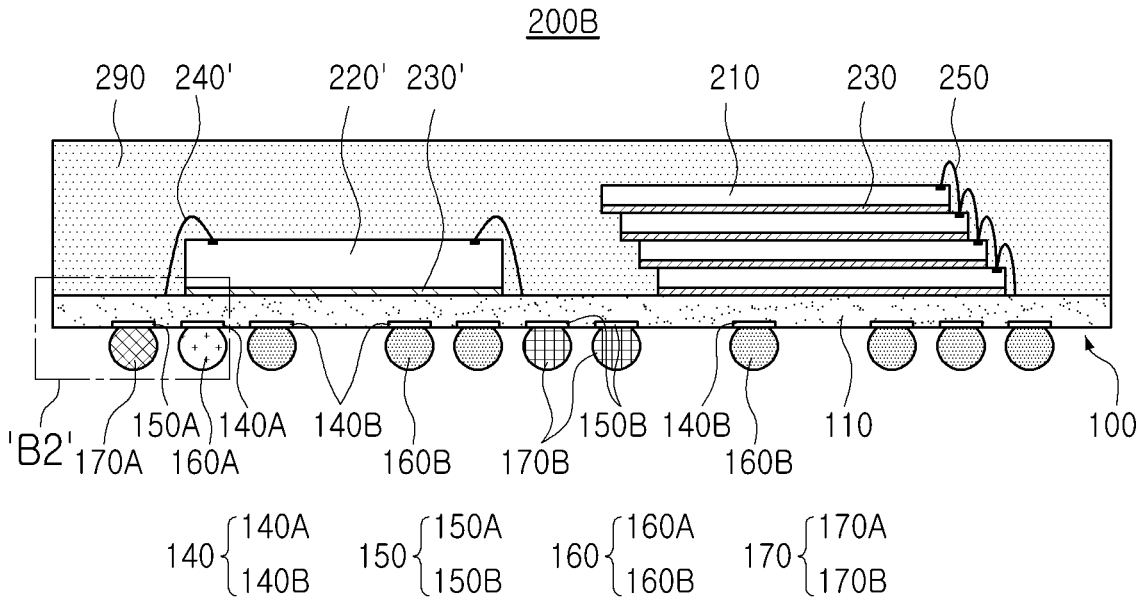
FIG. 12 is a cross-sectional view illustrating a semiconductor package according to an example embodiment of the present inventive concept.
Figure 13:
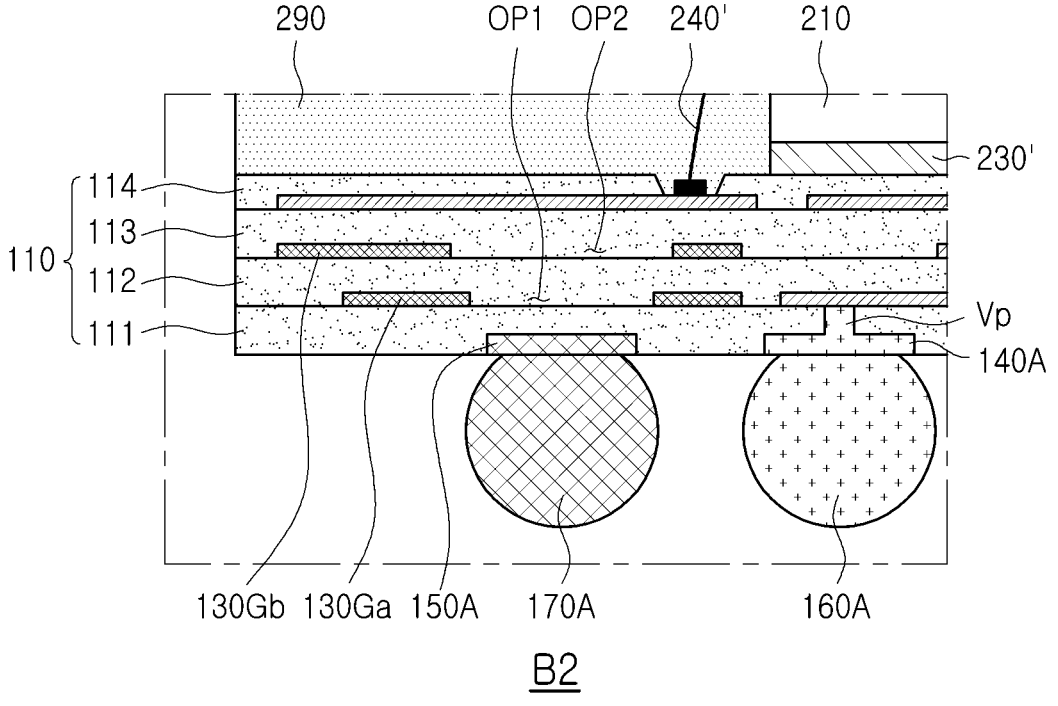
FIG. 13 is an enlarged partial view of portion ("B2") of the semiconductor package of FIG. 12.

FIG. 12 is a cross-sectional view illustrating a semiconductor package 200B according to an example embodiment of the present inventive concept, and FIG. 13 is an enlarged partial view of a portion ("B2") of the semiconductor package 200B of FIG. 12.

Referring to FIGS. 12 and 13, it can be understood as a structure similar to the embodiment illustrated in FIGS. 1 to 7, except that, in the semiconductor package 200B according to the present example embodiment, the second semiconductor chip 220' is connected to an interconnection layer 130L (for example, an upper pad 130P) of the package substrate 100 by wires 230', and first and second open regions OP1 and OP2 are positioned in a vertical direction on the non-contact pad 150.

Accordingly, the description of the example embodiment illustrated in FIGS. 1 to 7 may be combined with the description of the present example embodiment unless otherwise specifically stated. Unlike the previous example embodiment, the second semiconductor chip 220' employed in this embodiment may be connected to the interconnection layer 130L by a wire 230'. In addition, a first contact pad 140A, which is for transmitting a signal, and a first non-contact pad 150A adjacent thereto may be disposed adjacent to one edge of the package substrate 100, and a first contact bump 160A of the first contact pad 140A and a first non-contact bump 170A of the first non-contact pad 150A may be connected to each other on the same line. In this case, as illustrated in FIG. 13, a first open region OP1 and a second open region OP2 may be formed in a region of two metal pattern layers 130 overlapping the first non-contact bump 170A which is connected to the first non-contact pad 150A, respectively. For example, the first open region OP1 may be formed in a metal pattern layer 130Ga (or, e.g., a lowermost metal pattern layer) positioned on the lowermost insulating layer 111, and the second open region OP2 may be formed in a metal pattern layer 130Gb (or, e.g., a next lowermost metal pattern layer) positioned on the next lowermost insulating layer 112. Each of the metal pattern layers may be a ground pattern 130Ga and 130Gb. The method according to the present embodiment may be usefully used when the first and second insulating layers 111 and 112 are relatively thin.

As set forth above, according to an example embodiment of the present inventive concept, an open region may be formed in a metal pattern layer located above a non-contact bump (or a pad) that is connected to a signal line connected to a contact bump (or a pad) for transmitting a signal (e.g., a differential signal), so that capacitance generated by the non-contact bump can be reduced. As a result thereof, it is possible to reduce discontinuity in differential impedance and improve signal integrity (SI) characteristics.

While the present inventive concept has been described with reference to embodiments thereof, it will be understood by those of ordinary skill in the art that various changes in form and details may be made thereto without departing from the spirit and scope of the present inventive concept.

What is claimed is:

1. A semiconductor package, comprising:
a package substrate including a plurality of insulating layers and a plurality of metal pattern layers respectively disposed on the plurality of insulating layers, wherein each of the plurality of metal pattern layers has an interconnection layer;
at least one semiconductor chip disposed on an upper surface of the package substrate, and connected to the interconnection layer;
contact pads disposed on a lower surface of the package substrate, and connected to the interconnection layer; and
non-contact pads disposed on the lower surface of the package substrate, and insulated from the interconnection layer,
wherein a lowermost metal pattern layer among the plurality of metal pattern layers has a first open region at least partially overlapping a central portion of at least one non-contact pad among the non-contact pads, in a direction perpendicular to the upper surface of the package substrate.

2. The semiconductor package of claim 1, wherein the lowermost metal pattern layer comprises a ground pattern, and the first open region is located in the ground pattern.

3. The semiconductor package of claim 2, wherein the first open region is a hole in the ground pattern.

4. The semiconductor package of claim 1, wherein the first open region has an area greater than an area of the at least one non-contact pad.

5. The semiconductor package of claim 1, wherein a next lowermost metal pattern layer among the plurality of metal pattern layers is disposed on the lowermost metal pattern layer and has at least one second open region overlapping the at least one non-contact pad in the vertical direction.

6. The semiconductor package of claim 1, wherein the at least one non-contact pad is positioned between one of the contact pads and an edge of the package substrate.

7. The semiconductor package of claim 6, wherein the contact pads comprise first and second signal pads for transmitting a differential signal, and the one contact pad is one of the first or second signal pads.

8. The semiconductor package of claim 7, wherein the other one of the first or second signal pads is disposed closer to the edge of the package substrate than the one of the first or second signal pads.

9. The semiconductor package of claim 8, wherein the at least one non-contact pad and the other one of the first or second signal pads are disposed side by side at the edge of the package substrate.

10. The semiconductor package of claim 1, wherein an insulating layer between the lowermost metal pattern layer and the non-contact pads has a thickness of about 20 μm or less.

11. The semiconductor package of claim 1, further comprising conductive bumps respectively disposed on the contact pads and the non-contact pads.

12. The semiconductor package of claim 1, wherein the at least one semiconductor chip comprises a plurality of semiconductor chips.

13. The semiconductor package of claim 12, wherein the plurality of semiconductor chips comprise a memory chip and a processor chip for controlling an operation of the memory chip.

14. A semiconductor package, comprising:

a package substrate including a plurality of insulating layers and a plurality of metal pattern layers respectively disposed on the plurality of insulating layers, wherein each of the plurality of metal pattern layers has an interconnection layer;

a first semiconductor chip disposed on first surface of the package substrate, and connected to the interconnection layer;

a second semiconductor chip disposed on the first surface of the package substrate, and connected to the interconnection layer;

contact pads disposed on a second surface of the package substrate, and connected to the interconnection layer, wherein the contact pads include first and second signal pads for transmitting a differential signal, and non-contact pads disposed on the second surface of the package substrate, and insulated from the interconnection layer, wherein the non-contact pads comprise at least one non-contact pad disposed adjacent to the second signal pad and positioned closer to an edge of the package substrate than the second signal pad, wherein a first metal pattern layer among the plurality of interconnection layers has an open region overlapping the at least one non-contact pad among the non-contact pads in a direction perpendicular to the first surface of the package substrate.

15. The semiconductor package of claim 14, wherein the first signal pad is disposed closer to the edge of the package substrate than the second signal pad.

16. The semiconductor package of claim 15, wherein the at least one non-contact pad and the first signal pad are disposed side by side at the edge of the package substrate.

17. The semiconductor package of claim 14, wherein the first semiconductor chip comprises a memory device, and the second semiconductor chip comprises a processor chip configured to transmit/receive data to and from the memory device and to and from an external device using a serial interface.

18. The semiconductor package of claim 17, wherein the semiconductor package is a universal flash storage (UFS) device.

19. A semiconductor package, comprising:

a package substrate having a plurality of insulating layers and a plurality of metal pattern layers respectively disposed on the plurality of insulating layers, wherein each of the plurality of metal pattern layers has an interconnection layer;

at least one semiconductor chip disposed on an upper surface of the package substrate, and connected to the interconnection layer;

contact pads disposed on a lower surface of the package substrate, and connected to the interconnection layer, wherein the contact pads include a first signal pad and a second signal pad for transmitting a differential signal;

non-contact pads disposed on the lower surface of the package substrate, and insulated from the interconnection layer;

contact bumps respectively disposed on the contact pads; and non-contact bumps respectively disposed on the non-contact pads, wherein a lowermost metal pattern layer among the plurality of interconnection layers has an open region at least partially overlapping at least one non-contact pad among the non-contact pads.

20. An electronic device, comprising:

a circuit board having circuit lines; and the semiconductor package of claim 19 disposed on the circuit board, wherein the circuit lines comprise a first signal line and a second signal line, wherein the first signal line is connected to a contact bump disposed on the first signal pad, and the second signal line is connected to a contact bump disposed on the second signal pad and is connected to a non-contact bump disposed on the at least one non-contact pad.

* * * * *